United States Patent [19]
Lin et al.

[11] Patent Number: 5,718,991
[45] Date of Patent: Feb. 17, 1998

[54] METHOD FOR MAKING PHOTOMASKS HAVING REGIONS OF DIFFERENT LIGHT TRANSMISSIVITIES

[75] Inventors: Dhei-Jhai Lin, Taoyuan Hsien; Rong-Jer Lee, Yunlin Hsien; Hua-Chi Cheng, Hsinchu Hsien; Wen-Tung Cheng, Taoyuan Hsien, all of Taiwan

[73] Assignee: Industrial Technology Research Institute, Hsinchu, Taiwan

[21] Appl. No.: 773,829

[22] Filed: Dec. 27, 1996

[51] Int. Cl.$^6$ ................................................ G03F 9/00
[52] U.S. Cl. ................................................ 430/5; 430/7
[58] Field of Search ................................ 430/5, 7, 322, 430/324

[56] References Cited

U.S. PATENT DOCUMENTS 4,415,262  11/1983  Koyama et al. ........................... 430/5

*Primary Examiner*—S. Rosasco
*Attorney, Agent, or Firm*—W. Wayne Liauh

[57] ABSTRACT

An improved method for preparing multiple-exposure photomasks having at least three levels of transmissivity is disclosed. A conventional bi-exposure photomask is first formed which contains a macroscopically exposed area, a microscopically exposed area, and a masked area on a transparent substrate. Then a diffractive-refractive light-scattering optical element is formed above the microscopically exposed area so as to provide an exposure area with an intermediate light transmissivity. In a preferred embodiment, the diffractive-refractive light-scattering optical element above the microscopically exposed area is formed by first forming a transparent positive photoresist above the bi-exposure photomask. The transparent positive photoresist is exposed to an irradiation from the bottom of the transparent substrate, and is developed. Finally, the transparent positive photoresist is heated to cause a melt-flow thereof which forms a concave optical element above the microscopically exposed area. The transmissivity of the intermediate exposure area can be adjusted by adjusting the dimensions of the microscopical openings provided therein and the distance between the microscopic openings. More than one microscopic pattern can be provided on the same substrate so as to allow two or more intermediate transmissitivities to be obtained.

20 Claims, 5 Drawing Sheets

METHOD FOR MAKING PHOTOMASKS HAVING REGIONS OF DIFFERENT LIGHT TRANSMISSIVITIES

FIELD OF THE INVENTION

The present invention relates to a novel method for making photomasks having regions of different light transmissitivities, and the photomasks made therefrom. More specifically, the present invention relates to improved methods for making photomasks for use in photo lithographic processes utilizing proximity printing techniques which provide regions of different light transmissitivities, and the multiple-exposure photomasks (or more accurately, multiple-transmissivity photomasks) made from this novel process. The main advantage of the present invention is that the process itself resembles the conventional process for making bi-exposure photomasks (i. e., the photomasks have only two regions of exposure-exposed region and masked region); however, the photomasks made from the process of the present invention possess the capability of the much more expensive multiple exposure photomasks-they contain regions of intermediate light transmittance(s). The method disclosed in the present invention not only simplifies the manufacturing procedure for making multiple-exposure photomasks and greatly reduces the cost thereof, it also substantially ameliorates the degree of waste disposal problems typically associated with the conventional methods of making multiple-exposure photomasks.

BACKGROUND OF THE INVENTION

Multiple-exposure photomasks, as opposed to the conventional bi-exposure photomasks, are photomasks that provide three or more regions of distinct transmissitivities. Unlike the conventional bi-exposure photomasks, which contain only exposed ("on") and masked ("off") regions for light exposure, a multiple-exposure photomask, by definition, contains at least one additional region of intermediate light transmissivity. Multiple-exposure photomasks have been widely and advantageously used in making color filters for use in LCDs and in preparing multilayer circuit boards or patterns.

Conventional (i.e., bi-exposure) photomasks are made by forming a photomasking pattern on a transparent substrate. The photomasking pattern contains a light-transmitting region and a lightmasking region, and the photolithographic process comprises the step of irradiating light from the back (i.e., opposite the photomasking pattern) of the photomask onto another substrate containing a photoresist to transfer the photomasking pattern thereto, forming a latent image. Upon appropriate irradiating energy and appropriate development condition (such as the concentration of the developer solution, temperature, and development time, etc), a positive or negative image-depending on the chemical reaction that takes place in the photoresist-can be developed.

A positive image will be formed on a positive photoresist, which typically consists of a quinonediazide compound dissolved in a base-soluable organic polymers such as mixtures of phenolic resin and acid-containing acrylic resin, in the form of a filmable photosensitive polymeric mixture. Further discussions on such photosensitive polymeric mixtures can be found in "Semiconductor Lithography," by Wayne Moreau, the content of which is incorporated by reference.

Upon exposure to light irradiation, carboxylic groups will be formed in the positive photoresist, which then becomes soluble in basic developer solutions, and the rate of dissolution is determined by the amount of light exposure. The amount of exposure energy also determines the thickness of the remaining photoresist. Because the unexposed areas of the positive photoresist still exhibits photosensitivity, a positive photoresist can be subject to multiple exposures, i.e., the unexposed areas can be subject to one or more light exposures for additional developments. Such a multiple-exposure process is documented in several prior art publications, for example, Japanese Laid-Open Patent Application 61-203403.

A negative image is formed in a negative photoresist, which typically contains unsaturated double bonds or azide- or diazo-containing resins. Upon exposure to light irradiation, the former can be polymerized via free-radical-initiated polymerization, and the latter can be subjected to a cross-linking reaction. Additionally, a negative photoresist can contain a photo-acid-generating compound such as iodomium salt, which generates protonic acids and causes cationic polymerization reaction or curing.

With a negative photoresist, the amount of exposure energy also determines the degree of cross-linking or polymerization, which, in turn, results in different degrees of resistance to the developer solution. This characteristic allows a multiple-level photomask to be used to form multiple regions of transmissivities on a negative photoresist, by forming a microplastic structure with varying degrees of residual thickness on the negative photoresist. The remaining thickness is dictated by the amount of exposure energy. This process is discussed in U.S. Pat. No. 5,344,748.

Traditionally, color filters were made using bi-exposure photomasks in multiple stages of light exposure. However, the trend now is to use multiple-transmissivity photomasks in a single exposure stage. Conventionally, multiple-transmissivity photomasks are prepared by forming a photomask having regions of masking metal layers, such as chromium and titanium, or metal oxide layers, such as chromium oxide or titanium oxide, of different thicknesses, which provide different degrees of light transmissitivities. The conventional multiple-exposure photomasks are prepared utilizing multiple irradiations from electron sources or laser or mercury lamp light sources. The procedure also requires a multiplicity of alignment, exposure, development, and electroplating and etching of the metal or metal oxide layers.

While the conventional multiple-exposure photomasks allow many advantages in its applications, most of the commercially available multiple-exposure photomasks are of high costs, especially those of large area and/or for use in electrodepositing lithographic processes. Thus, it is highly desirable to develop alternate techniques that can be used to manufacture multiple-exposure photomasks that are of similar or even better quality, but at an economically affordable price.

Several of such alternative processes for making multiple-exposure photomasks, or to achieve the results that typically require a multiple-exposure photomask, have been taught in the art. These include U.S. Pat. Nos. 4,764,432; 5,134,058; 5,344,748, and Japan Pat. Laid-Open 61-203403. The contents thereof are incorporated herein by reference.

In U.S. Pat. No. 4,764,432, a photomask useful as stencil or reticle is disclosed which comprises a thin having regions of different optical transmissivity for light radiation of a predetermined spectral range. The thin layer consists of a silicon semiconductor material, and the regions of different transmissivity consist of the monocrystalline or amorphous phase of the mask material. The photomask is manufactured by irradiating a thin layer of monocrystalline silicon with a focused ion beam to convert the silicon within the irradiated regions into the amorphous phase.

In U.S. Pat. No. 5,134,058, it is disclosed a method for forming a fine pattern on a semiconductor having a step therein without using a multiple-exposure photomask. The method disclosed in the '058 patent comprises the steps of coating a photosensitive material on the surface of the semiconductor, pre-exposing the photosensitive material existing in the non-step area to UV rays through a photomask, exposing the entire photosensitive material through a second photomask to UV after removing the first photomask, and developing and removing only photosensitive material that is exposed to UV in the pre-exposing and exposing steps.

In U.S. Pat. No. 5,344,748, it is disclosed a method for preparing a specially designed radiation photomask with areas that permit the transmission of different amounts of exposing radiation. The photomask was prepared with partially vacuum metallized grey areas that permit the transmission of from 1 to about 32 percent of the actinic radiation, as well as areas that transmit 100% and 0% of the exposing radiation.

In U.S. Pat. No. 4,415,262, it is disclosed a method for preparing a photomask containing a plurality of small apertures, which collectively provide a light-diffusion region. However, with this system, in order to obtain uniform scattered light distribution, the distance between the apertures must be smaller than the resolution of the photolithography. In other words, if the resolution of the photolithography is in the micron range, the diameter of the apertures must be in the sub-micron range. Since this approach requires large-area patterns containing sub-micron apertures, it is very impractical and thus has not been utilized.

SUMMARY OF THE INVENTION

The primary object of the present invention is to develop a method for preparing multiple exposure (i.e., multiple-transmissivity) photomasks that can be used in photolithographic process for making for example, LCD color filters, multilayer circuit boards, etc. More specifically, the primary object of the present invention is to develop a method for preparing multiple-exposure photomasks with simplified procedure, greatly reduced manufacturing cost, and reduced degree of production waste disposal problems relative to the conventional methods of making multiple-exposure photomasks. The multiple-exposure photomasks prepared from the method of the present invention provide high quality and precision in making multiple degrees of exposure on a photoresist so as to allow different degrees of development to be made on the photoresist. The multiple-exposure photomasks prepared from the method of the present invention can be advantageously used in a variety of photolithographic processes in making, for example, LCD color filters, multilayer circuit boards, etc.

The present invention involves a novel approach in making multiple-exposure photomasks that is radically different from any of the methods disclosed in the prior art. In the present invention, the multiple-exposure photomask comprises at least three distinct regions: an exposed region (100% light transmissivity, on a relative scale), a masked region (0% light transmissivity, also on a relative scale), and a diffractive-refractive light-scattered region (intermediate light transmissivity). The diffractive-refractive light-scattered region is formed by first forming a plurality of small through holes, or apertures, on a predetermined region of the masked layer, then covering the apertures with a layer of light-scattering optical elements, preferably a plurality of matching concave lenses with a concave lens covering a respective aperture. The aperture controls the amount of light (thus, the degree of transmissivity) that will pass through this intermediate-exposure region, whereas the concave lens elements, in conjunction with the aperture itself, cause the transmitted light to be effectively scattered and uniformly distributed.

The word "aperture" in the present invention is broadly defined to indicated a light-transmitting region within an otherwise light-blocking masked area in the light-scattered region. In the present invention, the aperture can be of any desired geometry, for example, the "aperture" can be circular spaced apart dots, stripes, or networks. The transmissivity of the light-scattered region can also be controlled by the separation between the apertures. Preferably, the total area of the apertures should be controlled to be between 10–90%, or more preferably, between 30–80%, of the total area designed for the light-scattered region. If the ratio of the aperture area is too low, the (partially) transmitted light may not be adequately uniformly scattered.

In the present invention, the light-scattering optical elements should be made of a material that transmits lights at the spectral wavelengths of interest. However, The light-scattering optical elements can also be made from a material with partial light absorption so as to provide a second means for adjusting the amounts of light to be transmitted through the light-scattered region. Since the performance of the light-scattered region of the present invention can be influenced by a number of controllable factors, such as the refractive index, curvature, etc., of the light-scattering optical elements, the dimensions of the aperture, the distance between the apertures, and the separation between the photomask and the photoresist on which light is to be irradiated during a proximity printing process, the present invention allows a great variety of parameters to be adjusted in attempt to obtain the optimum results. With the conventional multiple-exposure photomasks, once a photomask is made, its properties are largely fixed.

In the present invention, the transparent substrate can be made from highly transparent hard or soft organic or inorganic materials, such as glass, quartz, or polyesters. The masking materials can be made from metals such as molybdenum, titanium, gold, aluminum, or chromium; dielectric materials such as chromium oxide, aluminum oxide; mixtures of filmable polymeric materials and metal oxide particles or carbon blacks; mixtures of filmable polymeric materials and organic or inorganic dyes which absorb light at wavelengths of interest. Typically, the optical density is proportional to the thickness of the masking layer. In the present invention, it is preferred that the optical density of the masking layer is greater than 2.0, more preferably greater than 3.0 or 4.0. It is also preferred that the thickness of the masking layer is no greater than the diameter of the apertures.

The photoresist suitable for use in the present invention can be either positive or negative photoresist. In addition to the various photoresists discussed above, a thermal curing agent, such as melamine or blocked isocyanate, etc., can also be added to the positive photoresist. Upon heating to elevated temperatures (typically greater than 120° C.), these curing agents can cause the positive photoresist to be hardened, thus increasing its chemical resistance against other solvents. In the present invention, the various layers, including the photoresist layer and the transparent layer which constitutes the refractive-diffusive optical elements, can be formed using a variety of techniques, including: spinning coating, roller coating, blade coating, screen coating, slot coating, dip coating, etc. It is preferred that the aggregate thickness of these layers does not exceed the diameter (or width) of the apertures.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a method for preparing multiple-exposure photomasks that can be used in photolithographic process for making LCD color filters, multi-layer circuit boards, etc. The method disclosed in the present invention allows high-quality multiple-exposure photomasks to be made with simplified procedure, greatly reduced manufacturing cost, and reduced degree of production waste disposal problems relative to the conventional methods of making multiple exposure photomasks. The multiple-exposure photomask disclosed in the present invention has at least three levels of transmissivity and comprises: (a) a macroscopically exposed area for high light transmissivity, (b) a masked area for low light transmissivity, and (c) an area of intermediate light transmissivity, formed on a transparent substrate. The intermediate light transmissivity area comprises a refractive light-scattering optical element formed above a microscopically exposed area, which comprises a plurality of through holes surrounded by a portion of said masked area. The macroscopically exposed area is similar to the exposed area of a conventional bi-exposure photomask wherein light passes without interference (i.e., diffraction), at the wavelength of interest. On comparison, the microscopically exposed area (i.e., the through holes) is dimensioned such that the light beam that travels therethrough will be diffracted so that it will be distributed over the region enclosing the macroscopically exposed area and its surrounding masked area. The refractive light-scattering optical element further improves the uniformity of the transmitted light and allows the dimensions of the through holes, and the distance therebetween, to be substantially increased without adversely affecting the resolution of the photolithographic process.

Figure 1:
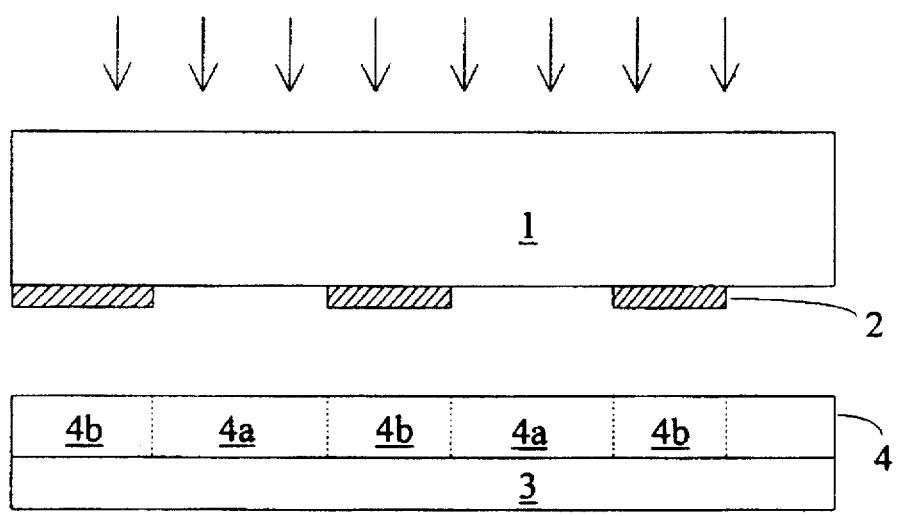
FIG. 1 is a schematic drawing showing the operations of a conventional photomask (bi-exposure).
Figure 2:
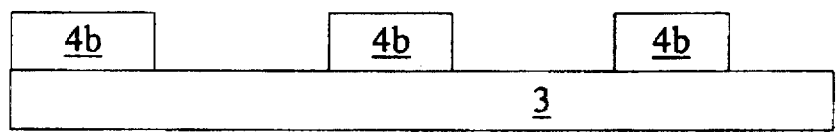
FIG. 2 is a schematic drawing showing the result of exposing a positive photoresist under the conventional bi-exposure photomask, followed by a subsequent development.
Figure 3:
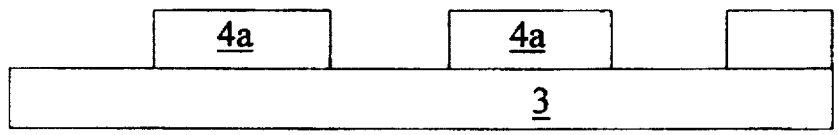
FIG. 3 is a schematic drawing showing the result of exposing a negative photoresist under the conventional bi-exposure photomask, followed by a subsequent development.

Now refer to the drawings. FIG. 1 is a schematic drawing showing the operations of a bi-exposure conventional photomask. In this conventional process, a "two-tone" photomask 2 is formed on a light-transmitting substrate 1. In transferring the pattern (i.e., image) of the photomask 2 onto a photoresist, light is irradiated from the back of the light-transmitting substrate 1 onto the photoresist 4, which includes an exposed region 4a and an unexposed region 4b formed on another substrate 3. Under appropriate exposure energy followed by appropriate development conditions (such as the concentration of the developer solution, development temperature and duration, etc.), either a positive image or a negative image of that of the photomask can be formed. FIG. 2 is a schematic drawing showing the result of exposing a positive photoresist under the conventional bi-exposure photomask, followed by a subsequent development. A positive image is formed on the positive photoresist (i.e., the exposed areas are removed via development). FIG. 3 is a schematic drawing showing the result of exposing a negative photoresist under the conventional bi-exposure photomask, followed by a subsequent development. FIG. 3 shows that a negative image is formed on the negative photoresist (i.e., the unexposed areas are removed via development).

Quinonediazide compounds are the most widely used positive-imaging-forming photosensitive compounds. Examples of these quinonediazide compounds include esters 1,2-naphthoquinone diazide-5-sulfonyl chloride or 1,2-naphthoquinone diazide-4-sulfonyl chloride with trihydroxybenzophenone. These and other quinonediazide compounds suitable for use in making positive photoresists are disclosed in U.S. Pat. Nos. 3,046,118; 3,148,983; 3,402,044; 4,115,128; 4,173,470; 4,550,069; 4,551,409; Laid-Open Japan Patent Application Nos. 60-134,235; 60-138,544; 60-143,355; 60-154,248; European Patent Application No. 0092444, and "Semiconductor Lithography" by Wayne Moreau. The contents of these patents, patent applications and treatise are hereby incorporated by reference. Typically, the positive photoresist is soluble in a basic aqueous solution containing organic polymers such as a variety of phenolic resin, acid-containing acrylic resins, etc., to form a filmable photosensitive polymeric mixture. Upon exposure, the photosensitive components of the positive photoresist are convened into carboxylic components, thus become soluble in a basic developer solution. The rate of dissolution of the exposed portion is typically determined by the amount of light exposure that it has been subject thereto. For certain positive photoresists, the amount of light exposure can also be utilized to control the thickness of the remaining photoresist layer in the exposed region. As discussed heretofore, this characteristic has been utilized to develop multiple-exposure photomasks in U.S. Pat. No. 5,134,058.

Some positive photoresists can also be utilized to provide certain multiple-exposure characteristics. For example, because the photosensitive components of unexposed photoresists may still possess photoactivity after development, a portion of the remaining photoresist (corresponding to the initially unexposed area) can be re-exposed for subsequent development. This technique was described in Japan Pat. Laid-Open 61-203403.

Them are also several types of negative photoresists. The most common types include those which will generate free radicals upon light exposure to cause polymerization among unsaturated double bonds; those diazo resins that utilize azide groups which will crosslink upon light exposure; and those that contain a photoacidizing agent, such as iodorium salt, which will generate hydrogen ions to subsequently cause a cationic polymerization. Subjecting the negative photoresist to different amounts of light exposure could also cause different degrees of polymerization or crosslinking resulting in different degrees of resistance to the development solution. With this type of negative photoresist, a pattern of microstructure with varying thickness can be developed using a multiple exposure process. A greater exposure would result in greater extent of chemical reaction, thus a stronger resistance to the developer solution and a less reduction of thickness during development. On the other hand, a less light exposure would result in thinner thickness of the remaining corresponding photoresist. This allows a three-dimensional microstructure to be developed using this type of negative photoresist. This method was illustrated in U.S. Pat. No. 5,344,748 discussed above.

Figures 4, 5:
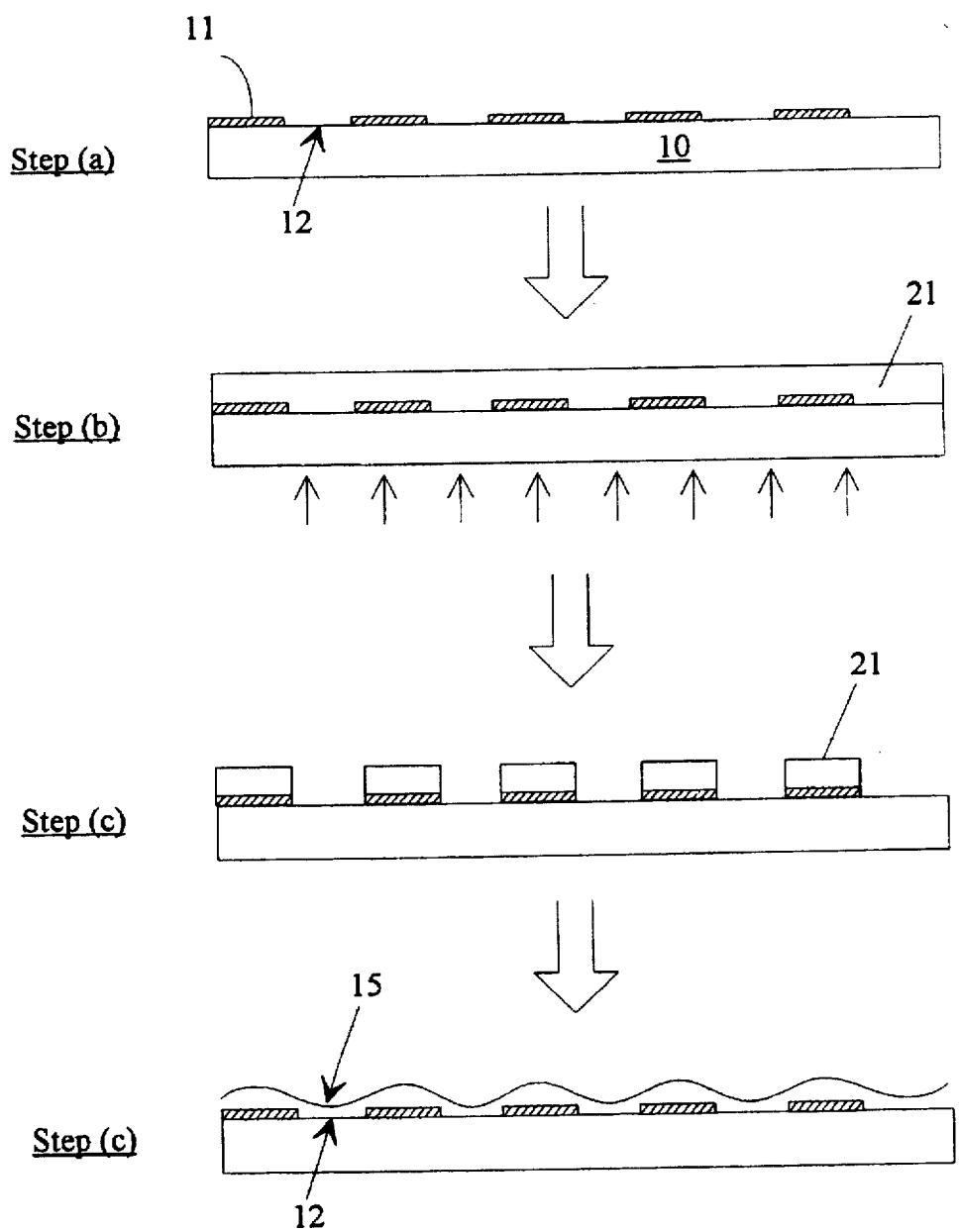
FIG. 4 is a schematic cross-sectional diagram showing the diffraction-refraction light-scattered region of the multiple-exposure photomask according to a first preferred embodiment of the present invention.
FIG. 5 is a schematic flowchart diagram showing the steps of preparing the diffraction-refraction light-scattered region of the multiple-exposure photomask shown in FIG. 4 according to the first preferred embodiment of the present invention.

One of the advantages of the process disclosed in the present invention is that it is very similar to the conventional method of making hi-exposure (exposed-and-masked) photomask, yet, it can produce multiple-exposure photomasks. FIG. 4 is a schematic cross-sectional diagram showing the diffraction-refraction light-scattered region of the multiple-exposure photomask according to a preferred embodiment of the present invention. The multiple-exposure photomask of the present invention contains three distinct regions of different light transmissivity: an exposed region (or a "macroscopically exposed region" with 100% light transmissivity, on a relative scale), a masked region (0% light transmissivity, also on a relative scale), and a diffractive-refractive light-scattered region (intermediate light transmissivity). The exposed region and the masked region are similar to those corresponding to a conventional bi-exposure photomask. Thus the present disclosure will concentrate only on the diffractive-refractive light-scattered, or the intermediate light transmissivity, region. FIG. 4 shows that region of intermediate light transmissivity consists of a substrate 10, masked area 11, a plurality of apertures 12 enclosed within the masked area 11, and a light-scattering optical element 14 formed above the apertures. Collectively, the apertures 12 constitute a "microscopically" exposed region (or partially transmitting region).

FIG. 4 also shows that the light scattering optical element 14 is formed as a collection of the individual concave lenses 15 each coveting a respective aperture 12, which has been formed through the specially patterned masked layer. The transparent substrate 10 can be made from a number of hard or soft organic or inorganic highly transparent materials, such as glass, quartz, polyesters. The masks can be prepared using any ordinary mask materials including metals, such as molybdenum, titanium, gold, aluminum, chromium, etc; metal oxides, such as chromium oxide, aluminum oxide, etc., polymeric materials containing metal or metal oxide particles; and polymeric materials containing pigments, dyes, or mixtures thereof.

The aperture 12 controls the amount of light that will be allowed to pass through this intermediate-exposure region, whereas the concave lens elements cause the transmitted light to be uniformly distributed. The aperture itself also provides a certain degree of light scattering by diffraction. It should be noted that, as indicated above, the word "aperture" in the present invention have been broadly defined to indicate a light-transmitting region within an otherwise light- blocking masked area in the light-scattered region. In the present invention, the aperture can be of any desired geometry, for example, it can be of a circular shape, a rectangular shape, or a linear pattern, and more than one pattern can be provided. Additionally, the apertures can be separated or connected to form a net, checkerboard, or any other desired pattern.

The transmissivity of the light-scattered region can be controlled by a number of factors, such as the opening of the aperture and the separation among the apertures. Preferably, the collective area of the apertures should be controlled to be between 10–90%, or more preferably, between 30–80%, of the total area designed for the light-scattered region. If the ratio of the aperture area is too low, the transmitted (partially) may not be adequately uniformed scattered. Preferably, the dimension of the aperture should be several times, or an order of magnitude, greater than the wavelength of the intended irradiation rays. Within the same amount of total aperture area, if the dimension of the individual aperture is too small, a higher cost will incur as a result. However, if the dimension of the individual aperture is too large, the transmitted light may not be effectively scattered.

FIG. 5 is a schematic flowchart diagram showing the steps of preparing the diffraction-refraction light-scattered region of the multiple-exposure photomask shown in FIG. 4 according to a preferred embodiment of the present invention. Prior to the fabrication process, a region is selected which is to provide an intermediate light transmissivity. In step (a), a pattern is formed on a predetermined part of the transparent substrate 10 which consists of a plurality of apertures 12 enclosed by masked area 11. In step (b), a transparent (after hardening) positive photoresist 21 is formed on the substrate covering both the apertures 12 and the masked area 11. In step (c), the positive photoresist is developed after light rays are irradiated from the back (i.e., bottom) of the substrate to cause a chemical reaction in the exposed areas of the photoresist. In step (d), the substrate is placed inside an over, in which the remaining photoresist is partially melted to form a wavy structure containing a plurality of concaved sub-structures 15 covering the apertures 12. Each of the concaved sub-structures 15 provides the function as a light-scattering concave lens. The photoresist can be obtained from a wide variety of appropriate material, including a mixture of quinonediazide compounds and phenol formaldehyde resin. Other base-developable resins, such as carboxylic group-containing acrylic resins or other phenolic resins can also be used substituting the phenol formaldehyde resin. Other positive photoresists that are suitable for practicing the present invention can be found, for example, in the treatise entitled "Semiconductor Lithography" by Wayne Moreau. One of the advantage of using a positive photoresist is that the positive photoresist rarely crosslinks, thus ensuring a desirable rheology in the post-development melting step.

In selecting the appropriate photoresist material, it is often necessary to take into consideration the transmissivity thereof at the wavelength in which the final photomask is to be operated. For example, if an i-line (at 365 nm) is to be irradiated on the photomask, it is preferred that the photoresist be made from an acrylic resin, because of its high transmissivity at this wavelength. Furthermore, because the photosensitive components in the photoresist can also absorb light, it is preferred to irradiate UV rays before and after the melt-flow process to effectuate a photobleaching effect to reduce its light absorbance. The duration and temperature of the melt-flow process are dictated by the type of photoresist employed. It is preferred that the melt-flow process be conducted in a nitrogen or other inert environment, so as to avoid any unnecessary oxidation reaction.

Figure 6:
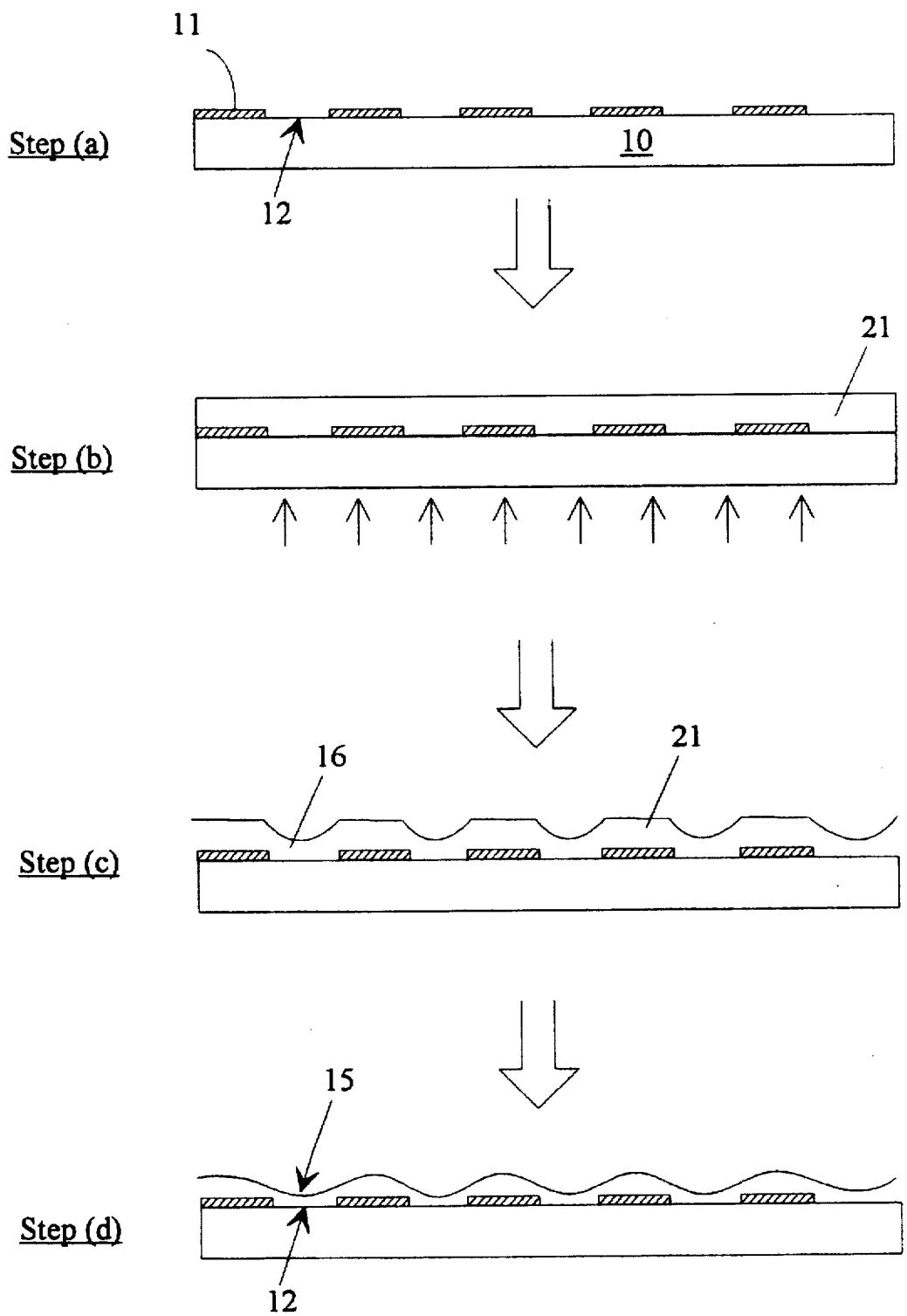
FIG. 6 is a schematic flowchart diagram showing the steps of preparing the diffraction-refraction light-scattered region of the multiple-exposure photomask shown in FIG. 4 according to a second preferred embodiment of the present invention.

FIG. 6 is a schematic flowchart diagram showing the steps of preparing the diffraction-refraction light-scattered region of the multiple-exposure photomask shown in FIG. 4 according to another preferred embodiment of the present invention. The main difference between the embodiment shown in FIG. 6 and that shown in FIG. 5 is that, in FIG. 6, the irradiation step is relatively incomplete so that a portion of the photoresist will remain on top of the apertures 12. This modification reduces the amount of time in which the photoresist must be subject to a post-development melt-flow process, and can result in further reduction in the manufacturing cost.

Figure 7:
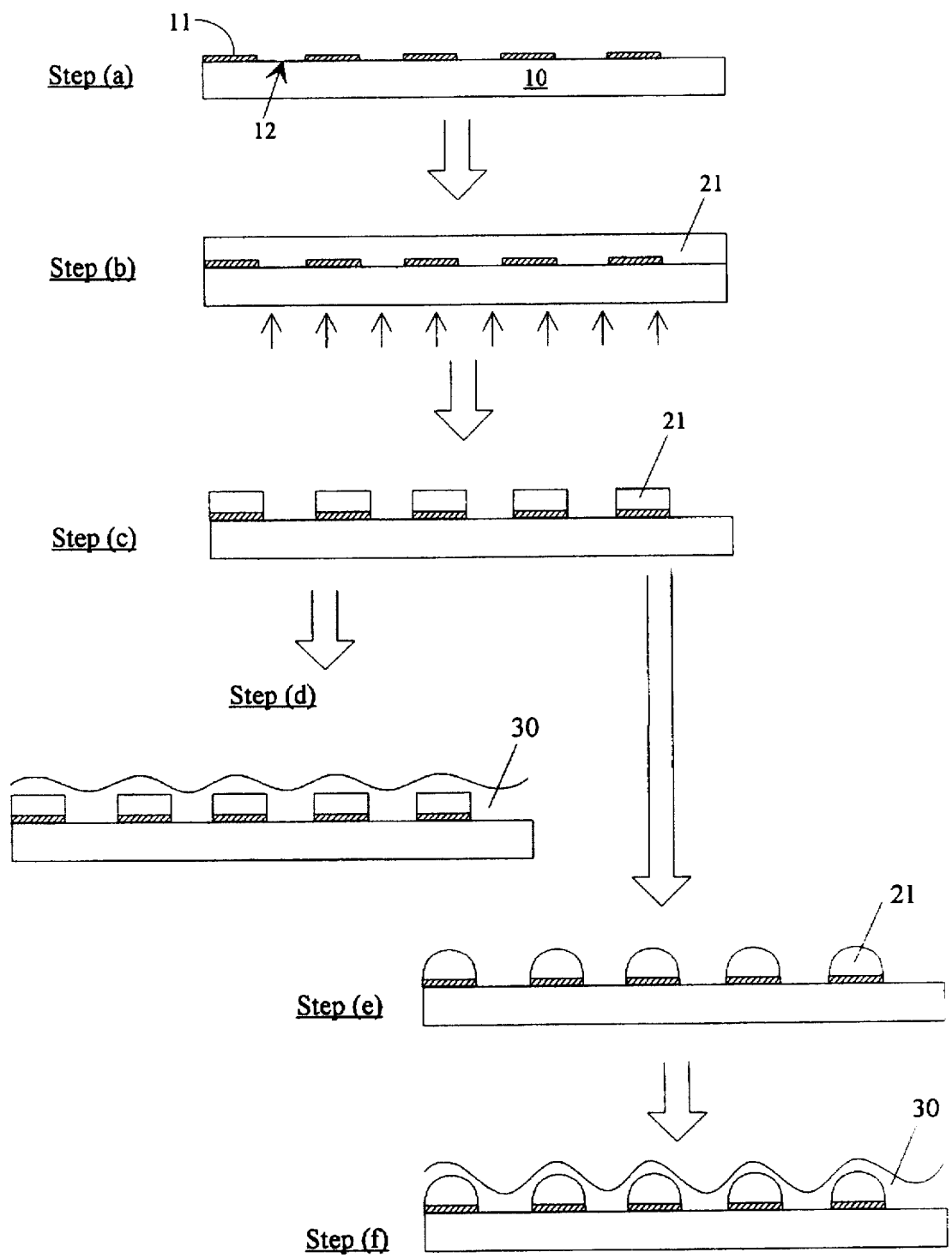
FIG. 7 is a schematic flowchart diagram showing the steps of preparing the diffraction-refraction light-scattered region of the multiple-exposure photomask of the present invention according to a third preferred embodiment.

FIG. 7 is a schematic flowchart diagram showing the steps of preparing the diffraction-refraction light-scattered region of the multiple-exposure photomask of the present invention according to yet another preferred embodiment. This embodiment takes advantage of certain unique rheological properties of the highly viscous polymer solutions. Steps (a)–(c) of FIG. 7 are identical to those shown in FIG. 5, except that the thickness of the positive photoresist is reduced. A transparent polymer film 30 is then coated on the photomask above the photoresist. The rheological property of the polymer film 30 allows it to assume a wavy shape after it is dried, as shown in step (d). Unlike the previous embodiment, the concave lens element is formed with the polymer film, and not with the photoresist. The transparent polymer film can be coated onto the photomask using a variety of techniques, such as spinning coating, roller coating, blade coating, screen coating, slot coating, curtain coating, dip coating, etc. Steps (e) and (f) show that the photoresist can be melted to assume a hemispheric shape on top of the masked areas, prior to the coating of the transparent film. In this embodiment, the photoresist must be nonwetting relative to the mask material. Preferably, the combined thickness of the photoresist and the transparent polymer film should not exceed the opening of the aperture.

In the embodiment shown in FIG. 7, the main function of the transparent positive photoresist is to provide an infrastructure on which the wavy transparent polymer film can be formed. The transparent positive photoresist can be dispensed with by increasing the thickness of the masked area.

Figure 8:
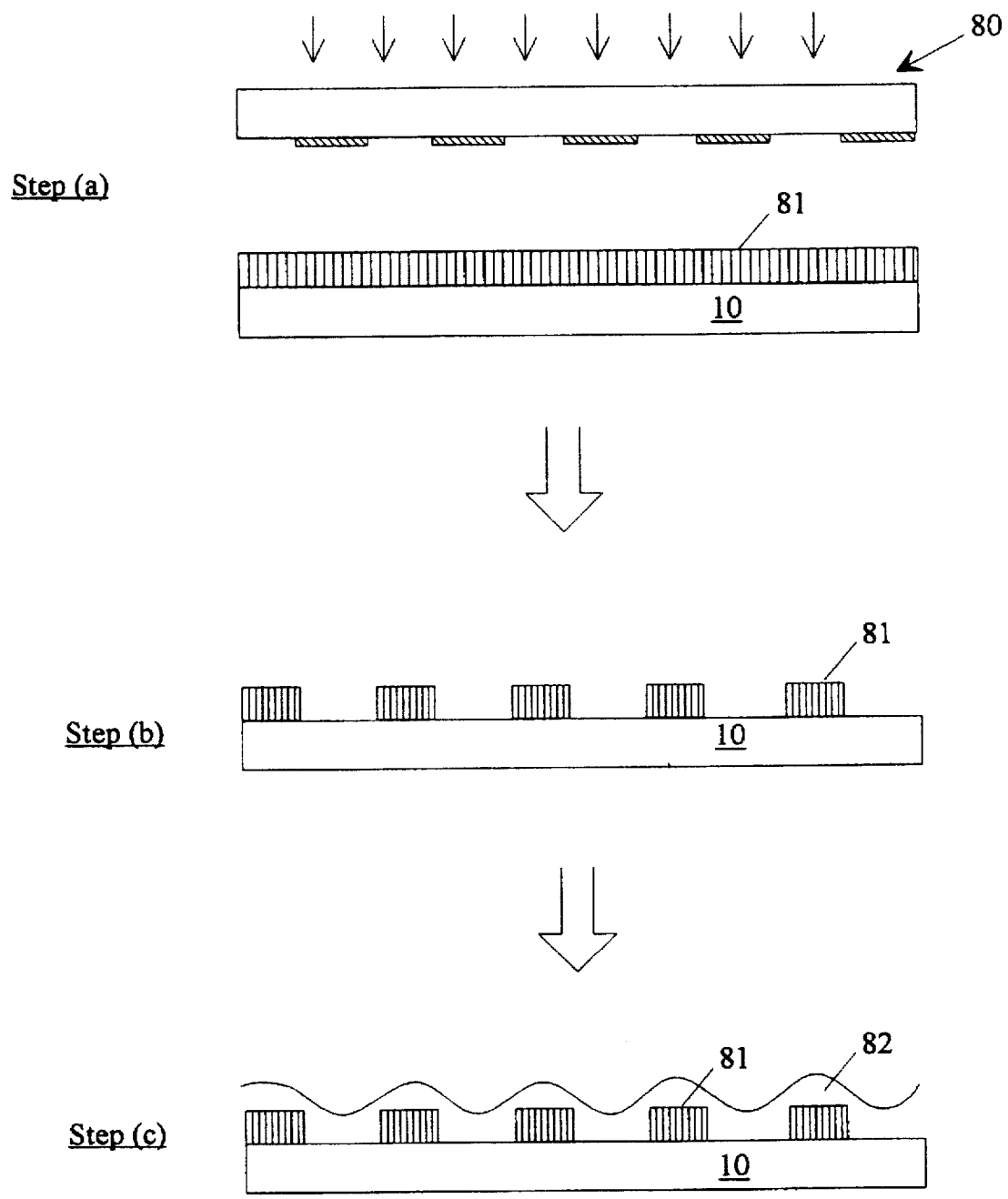
FIG. 8 is a schematic flowchart diagram showing the steps of preparing the diffraction-refraction light-scattered region of the multiple-exposure photomask of the present invention according to a fourth preferred embodiment utilizing a negative photoresist.

The multiple-exposure photomask of the present invention can also be made using a negative photoresist. FIG. 8 is a schematic flowchart diagram showing the steps of preparing the diffraction-refraction light-scattered region of the multiple-exposure photomask of the present invention according to a fourth preferred embodiment utilizing a negative photoresist. This process includes four steps: (a) forming an opaque negative photoresist 81 on another transparent substrate 10 (this step is not shown); (b) transforming a pattern of a bi-exposure photomask 80 into the opaque negative photoresist provided on another transparent substrate by light irradiation (as shown in step (a)) and development (step (b)); (c) forming a layer of a viscous transparent material 82 on the opaque negative photoresist having the same pattern as said bi-exposure photomask (not shown); and (d) allowing the viscous transparent material to flow toward the microscopically exposed area and drying the viscous transparent material so as to form a refractive concave optical element from the viscous transparent material above the microscopically exposed area (as shown in step (c)).

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Preparation of a Photomask (Corresponding to the Embodiment Shown in FIG. 5)

A bi-exposure photomask was formed which contained an exposed area and a chromium-film masked area provided on a glass substrate. The chromium-film masked area contained a microscopically exposed region having exposed stripes 10 µm wide that were spaced at a distance of 10 µm apart. A positive photoresist having a thickness of 1.8 µm was coated onto the photomask using a spinning mating technique. A fight irradiating machine, ORC MMN-6, was used to irradiate UV rays at 300 mJ/cm$^2$ from the back of the glass substrate. The photoresist was developed by removing the exposed regions thereof using a 1% KOH potassium hydroxide solution to reveal a pattern corresponding to that of the originally masked area. The photomask was placed inside an oven at 130° C. for 20 minutes so as to cause a melt-flow of the photoresist. The melt-flow of the photoresist caused it to assume a wavy shape having concaved portions on top of the exposed stripes. This constituted an intermediate exposure area.

EXAMPLE 2

Preparation of Three-Level Photoresist Pattern

A positive photoresist having a thickness of 2.1 µm was formed on a glass substrate. The photoresist obtained in Example 1 was used for masked irradiation. The exposure energy during the irradiation was 150 mJ/cm$^2$, and the photoresist was held at a distance of 126 µm from the photomask using a spacer. After the exposure, the photoresist was developed using a 0.5% potassium hydroxide solution for 3 minutes. A photoresist having three distinct thicknesses of 2.0 µm, 0.6 µm, and 0 µm was obtained, corresponding to the masked area, the intermediate exposure area, and the exposed area of the photomask, respectively.

EXAMPLE 3

Preparation of a Photomask (Corresponding to the Embodiment Shown in FIG. 6)

A bi-exposure photomask was formed which contained an exposed area and a chromium-film masked area provided on a glass substrate. The chromium-film masked area contained two stripe regions. The first stripe region had exposed stripes 10 µm wide that were spaced at a distance of 10 µm apart. The second stripe region had exposed stripes 10 µm wide that were spaced at a distance of 5 µm apart. A positive photoresist having a thickness of 1.9 µm was coated onto the photomask using a spinning coating technique. A light irradiating machine, ORC MMN-6, was used to irradiate UV rays at 300 mJ/cm² from the back of the glass substrate. The photoresist was developed by removing the exposed regions thereof using a 1% KOH potassium hydroxide solution for 1.5 minutes to reveal a pattern corresponding to that of the originally masked area. The photomask was placed inside an oven at 130° C. for 20 minutes so as to cause a melt-flow of the photoresist. The melt-flow of the photoresist caused it to assume a wavy shape having concaved portions on top of the exposed stripes. Two intermediate exposure areas were thus formed corresponding to the first and second stripe regions, respectively.

EXAMPLE 4

Preparation of Four-Level Photoresist Pattern

A positive photoresist having a thickness of 2.1 µm was formed on a glass substrate. The photoresist obtained in Example 3 was used for irradiation. The exposure energy during the irradiation was 300 mJ/cm², and the photoresist was held at a distance of 126 µm from the photomask using a spacer. After the exposure, the photoresist was developed using a 0.5% potassium hydroxide solution for 2 minutes. A photoresist having four distinct thicknesses of 2.0 µm, 1.3 µm, 0.8 µm, and 0 µm was obtained, corresponding to the masked area, the first intermediate exposure area, the second intermediate exposure area, and the exposed area of the photomask, respectively.

EXAMPLE 5

Preparation of a Photomask (Corresponding to the Embodiment Shown in FIG. 7)

A bi-exposure photomask was formed which contained an exposed area and a chromium-film masked area provided on a glass substrate. The chromium-film masked area contained a stripe region having exposed stripes 10 µm wide that were spaced at a distance of 10 µm apart. A positive photoresist having a thickness of 2.0 µm was coated onto the photomask using a spinning coating technique. A light irradiating machine, ORC MMN-6, was used to irradiate UV rays at 300 mJ/cm² from the back of the glass substrate. The photoresist was developed by removing the exposed regions thereof using a 1% KOH potassium hydroxide solution for 2.0 minutes to reveal a pattern corresponding to that of the originally masked area. An aqueous solution of polyvinylpyrrolidone (PVP) containing a small amount of a surface active agent was coated on the photomask using a spinning coating technique. After drying, a wavy transparent PVP film was formed on the photomask. This formed an intermediate exposure area with a film thickness of 2.2 µm.

EXAMPLE 6

Preparation of Three-Level Photoresist Pattern

A positive photoresist having a thickness of 1.8 µm was formed on a glass substrate. The photoresist obtained in Example 3a was used for irradiation. The exposure energy during the UV irradiation was 150 mJ/cm², and the photoresist was held at a distance of 126 µm from the photomask using a spacer. After the exposure, the photoresist was developed using a 0.5% potassium hydroxide solution for 2 minutes. A photoresist having three distinct thicknesses of 1.75 µm, 0.7 µm, and 0 µm was obtained, corresponding to the masked area, the intermediate exposure area, and the exposed area of the photomask, respectively.

EXAMPLE 7

Preparation of a Photomask (Corresponding to the Modified Embodiment shown in FIG. 7)

The procedure in Example 4a was similar to that of Example 3a, except that 1.5 wt % (per weight of the positive photoresist solution) of melamine (R-757 Monsanto Co.), which served as a thermal cross-linking agent, was added. After development, the photomask was placed inside a 140° C. oven for 60 minutes to cause a melt-flow and subsequent hardening. The transparent polymer film was prepared using polymethylmethacrylate (PMMA), instead of PVP. The polymer film was dried at a rate of 85° C./hr, and a final thickness of 1.5 µm was obtained above the exposed stripes. This constituted the intermediate exposure area.

EXAMPLE 8

Preparation of Three-Level Photoresist Pattern

The procedure in Example 4b was identical to that in Example 3b, and a photoresist having three distinct thicknesses of 1.7 µm, 0.8 µm, and 0 µm was obtained, corresponding to the masked area, the intermediate exposure area, and the exposed area of the photomask, respectively.

EXAMPLE 9

Preparation of a Photomask (Corresponding to the Embodiment Shown in FIG. 8)

A negative photoresist containing carbon black pigments was coated on a glass substrate using a spinning coating technique. The negative photoresist was obtained from JSR, Japan, with an optical density of 2.0/µm. A bi-exposure photomask obtained using a similar procedure as that described in Example 5 was used to lithographically transfer the same pattern on the negative photoresist. The same light irradiating machine, ORC MMN-6, was used to irradiate UV rays at 400 mJ/cm² using a contact exposure technique. The negative photoresist was developed by removing the unexposed regions thereof using a 1% KOH potassium hydroxide solution for 2.0 minutes to reveal a negative image corresponding to that of the hi-exposure photomask. The black pattern was dried to obtain a final thickness of 1.7 µm Thereafter, the same acrylic resin used in Example 7 was similarly coated on the photomask which had a dry thickness of 1.5 µm. This constituted the intermediate exposure area.

EXAMPLE 10

Preparation of Three-Level Photoresist Pattern

A positive photoresist having a thickness of 2.1 µm was formed on a glass substrate. The photoresist obtained in Example 9 was used for irradiation. The exposure energy during the UV irradiation was 150 mJ/cm², and the photoresist was held at a distance of 126 µm from the photomask using a spacer. After the exposure, the photoresist was developed using a 0.5% potassium hydroxide solution for 2 minutes. A photoresist having three distinct thicknesses of 2.0 µm, 0.7 µm, and 0 µm was obtained, corresponding to the masked area, the intermediate exposure area, and the exposed area of the photomask, respectively.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for preparing multiple-exposure photomasks having at least three levels of transmissivity comprising the steps of:

(a) forming a hi-exposure photomask containing a microscopically exposed area and a masked area on a transparent substrate, wherein said microscopically exposed area comprises a plurality of through holes surrounded by a portion of said masked area; and (b) forming a refractive light-scattering optical element above said microscopically exposed area so as to cause a light ray through said microscopically exposed area to be uniformly distributed.

2. The method for preparing multiple-exposure photomasks having at least three levels of transmissivity according to claim 1 wherein said step of forming said refractive light-scattering optical element above said microscopically exposed area comprises the steps of:

(a) forming a transparent positive photoresist above said bi-exposure photomask covering said said microscopically exposed area and said masked area;

(b) exposing said transparent positive photoresist to an irradiation from a bottom of said transparent substrate;

(c) developing said exposed transparent positive photoresist; and (d) heating said transparent positive photoresist to cause a melt-flow thereof such that a concave refractive optical element is formed above said microscopically exposed area.

3. The method for preparing multiple-exposure photomasks having at least three levels of transmissivity according to claim 2 wherein said steps of exposing and developing said transparent positive photoresist are conducted such that said microscopically exposed area becomes fully exposed after said developing step.

4. The method for preparing multiple-exposure photomasks having at least three levels of transmissivity according to claim 2 wherein said steps of exposing and developing said transparent positive photoresist are conducted such that said a portion of said transparent positive photoresist still remains above said microscopically exposed area after said developing step.

5. The method for preparing multiple-exposure photomasks having at least three levels of transmissivity according to claim 1 wherein said step of forming said refractive light-scattering optical element above said microscopically exposed area comprises the steps of:

(a) forming a transparent positive photoresist above said bi-exposure photomask covering said microscopically exposed area and said masked area;

(b) exposing said transparent positive photoresist to irradiation from a bottom of said transparent substrate;

(c) developing said exposed transparent positive photoresist;

(d) forming a layer of a viscous transparent material on said transparent positive photoresist; and (e) allowing said viscous transparent material to flow over said microscopically exposed area and drying said viscous transparent material so as to form a concave refractive optical element from said viscous transparent material above said microscopically exposed area.

6. The method for preparing multiple-exposure photomasks having at least three levels of transmissivity according to claim 5 wherein said transparent positive photoresist is heated to cause a melt-flow thereof after development.

7. The method for preparing multiple-exposure photomasks having at least three levels of transmissivity according to claim 1 which further comprises the steps of:

(a) forming an opaque negative photoresist on another transparent substrate;

(b) transforming a pattern of said bi-exposure photomask into said opaque negative photoresist provided on another transparent substrate by light irradiation and development;

(c) forming a layer of a viscous transparent material on said opaque negative photoresist having the same pattern as said bi-exposure photomask; and (d) allowing said viscous transparent material to flow over said microscopically exposed area and drying said viscous transparent material so as to form a refractive concave optical element from said viscous transparent material above said microscopically exposed area.

8. The method for preparing multiple-exposure photomasks having at least three levels of transmissivity according to claim 1 wherein said through holes are provided having a texture selected from the group consisting of stripes, grid, dot matrix, and combinations thereof.

9. The method for preparing multiple-exposure photomasks having at least three levels of transmissivity according to claim 1 which contains two said microscopically exposed areas with different sized through holes and different levels of light transmissivity.

10. A multiple-exposure photomask having at least three levels of transmissivity comprising:

(a) a masked area for low light transmissivity and an area of partial light transmissivity, formed on a transparent substrate;

(b) wherein said partial light transmissivity area comprises a refractive light-scattering optical element formed above a microscopically exposed area, which comprises a plurality of through holes surrounded by a portion of said masked area.

11. The multiple-exposure photomask having at least three levels of transmissivity according to claim 10 wherein said refractive light-scattering optical element is formed above said microscopically exposed area using a process which comprises the steps of:

(a) forming a bi-exposure photomask containing said microscopically exposed area and said masked area on said transparent substrate; and (b) forming said refractive light-scattering optical element above said microscopically exposed area so as to form an exposure area with a partial light transmissivity.

12. The multiple-exposure photomask having at least three levels of transmissivity according to claim 11 wherein said step of forming said refractive light-scattering optical element above said microscopically exposed area comprises the steps of:

(a) forming a transparent positive photoresist above said bi-exposure photomask covering said microscopically exposed area and said masked area;

(b) exposing said transparent positive photoresist from a bottom of said transparent substrate;

(c) developing said exposed transparent positive photoresist; and (d) heating said transparent positive photoresist to cause a melt-flow thereof such that a concave optical element is formed above said microscopically exposed area.

13. The multiple-exposure photomask having at least three levels of transmissivity according to claim 12 wherein said steps of exposing and developing said transparent positive photoresist are conducted such that said microscopically exposed area becomes fully exposed after said developing step.

14. The multiple-exposure photomask having at least three levels of transmissivity according to claim 12 wherein said steps of exposing and developing said transparent positive photoresist are conducted such that said a portion of said transparent positive photoresist still remains above said microscopically exposed area after said developing step.

15. The multiple-exposure photomask having at least three levels of transmissivity according to claim 11 wherein said step of forming said refractive light-scattering optical element above said microscopically exposed area comprises the steps of:

(a) forming a transparent positive photoresist above said bi-exposure photomask coveting said microscopically exposed area and said masked area;

(b) exposing said transparent positive photoresist from a bottom of said transparent substrate;

(c) developing said exposed transparent positive photoresist;

(d) forming a layer of a viscous transparent material on said transparent positive photoresist; and (e) allowing said viscous transparent material to flow over said microscopically exposed area and drying said viscous transparent material so as to form a concave optical element from said viscous transparent material above said microscopically exposed area.

16. The multiple-exposure photomask having at least three levels of transmissivity according to claim 15 wherein said viscous transparent material contains an aqueous solution of polyvinylpyrrolidone and a small amount of a surface active agent.

17. The multiple-exposure photomask having at least three levels of transmissivity according to claim 16 wherein said transparent positive photoresist is heated to cause a melt-flow thereof after development, and said viscous transparent material contains an aqueous solution of polymethylmethacrylate.

18. The multiple-exposure photomask having at least three levels of transmissivity according to claim 11 wherein said process of forming said refractive light-scattering optical element further comprises the steps of:

(a) forming an opaque negative photoresist on another transparent substrate;

(b) transforming a pattern of said bi-exposure photomask into said opaque negative photoresist provided on another transparent substrate by light irradiation and development;

(c) forming a layer of a viscous transparent material on said opaque negative photoresist having the same pattern as said bi-exposure photomask; and (d) allowing said viscous transparent material to flow over said microscopically exposed area and drying said viscous transparent material so as to form a refractive concave optical element from said viscous transparent material above said microscopically exposed area.

19. The multiple-exposure photomask having at least three levels of transmissivity according to claim 11 wherein said through holes in said microscopically exposed area have a texture selected from the group consisting of stripes, grid, dot matrix, and combinations thereof.

20. A method for making color filters including the steps of exposing a photoresist to a light irradiation via a multiple-exposure photomasks wherein said multiple-exposure photomasks comprises:

(a) a masked area for low light transmissivity and an area of partial light transmissivity, formed on a transparent substrate;

(b) further wherein said partial light transmissivity area comprises a refractive light scattering optical element formed above a microscopically exposed area, which comprises a plurality of through holes surrounded by a portion of said masked area.

* * * * *